United States Patent
Grundlingh et al.

(10) Patent No.: US 7,689,180 B2
(45) Date of Patent: Mar. 30, 2010

(54) METHOD AND APPARATUS FOR A CARTESIAN ERROR FEEDBACK CIRCUIT TO CORRECT DISTORTION WITHIN A POWER AMPLIFIER

(75) Inventors: Johan Grundlingh, Kinburn (CA); Howard James Smith, Bishop's Stortford (GB); John Nisbet, Nepean (CA); Gordon G. Rabjohn, Ottawa (CA)

(73) Assignee: SiGe Semiconductor Inc., Ottawa, Ontario (CA)

( * ) Notice: Subject to any disclaimer, the term of this patent is extended or adjusted under 35 U.S.C. 154(b) by 504 days.

(21) Appl. No.: 11/798,566

(22) Filed: May 15, 2007

(65) Prior Publication Data
US 2008/0287077 A1    Nov. 20, 2008

(51) Int. Cl.
*H04B 1/04* (2006.01)
(52) U.S. Cl. .................. 455/126; 455/114.3; 330/149
(58) Field of Classification Search ........... 455/63.1, 455/114.2, 114.3, 118, 126; 330/149; 375/297
See application file for complete search history.

(56) References Cited

U.S. PATENT DOCUMENTS

| | | | | |
|---|---|---|---|---|
| 5,420,536 A | * | 5/1995 | Faulkner et al. | 330/149 |
| 5,469,105 A | * | 11/1995 | Sparks | 330/129 |
| 5,978,662 A | * | 11/1999 | Swales | 455/126 |
| 5,990,734 A | * | 11/1999 | Wright et al. | 330/2 |
| 6,081,698 A | * | 6/2000 | Moriyama et al. | 455/126 |
| 6,639,950 B1 | * | 10/2003 | Lagerblom et al. | 375/297 |
| 7,062,233 B2 | * | 6/2006 | Huttunen | 455/114.3 |
| 7,177,366 B1 | * | 2/2007 | Dawson et al. | 375/295 |
| 2002/0187761 A1 | * | 12/2002 | Im et al. | 455/126 |
| 2008/0171522 A1 | * | 7/2008 | Ben-Ayun et al. | 455/126 |

\* cited by examiner

*Primary Examiner*—Blane J Jackson
(74) *Attorney, Agent, or Firm*—Townsend and Townsend and Crew LLP

(57) ABSTRACT

A method of reducing distortion in the output of an amplifier is provided. The method comprises subtractively combining baseband error signals with the appropriate phase shift with baseband input signals, the baseband error signals generated by subtractively combining delayed fed-forward portions of the baseband input signals with baseband converted portions of a fed-back amplified output signal, the amplified output signal being a distorted replica of combined up-converted baseband input signals. The baseband error signals being filtered prior to the combining function, and also providing inputs to a controller which adjusts active elements of the amplification and fed-back paths in order to minimize the distortion within the output of the amplifier.

45 Claims, 6 Drawing Sheets

METHOD AND APPARATUS FOR A CARTESIAN ERROR FEEDBACK CIRCUIT TO CORRECT DISTORTION WITHIN A POWER AMPLIFIER

FIELD OF THE INVENTION

The invention relates to microwave amplifiers, and more specifically to correcting distortion generated in microwave amplifiers.

BACKGROUND OF THE INVENTION

In recent years, advances in semiconductor integrated circuits for wireless and RF technology have dramatically changed our perceptions, use, and reliance upon portable electronic devices. The uses of wireless technology are widespread, increasing, and include, but are not limited to, telephony, Internet e-mail, Internet web browsers, global positioning, photography, diary, address book, and in-store navigation. Additionally, devices incorporating wireless technology have expanded to include not only cellular telephones, but Personal Data Analyzers (PDAs), laptop computers, palmtop computers, gaming consoles, printers, telephone headsets, portable music players, point of sale terminals, global positioning systems, inventory control systems, and even vending machines. Today, many of these devices are high volume consumer commodities supplied by businesses competing through integrated features and rapidly changing branding whilst reinforcing customers desire for small size, long battery life, and lightweight devices with increased roaming capabilities and download speeds. Within a matter of a few years, these systems have evolved from bulky cellular telephones offering voice and simple text messaging to lightweight compact multi-media players providing streaming live video and music alongside telephony, PDA functionality, integrated mega pixel CCD camera, and supporting Blue-Tooth™ wireless peripheral interfaces for headphones, microphones etc.

Semiconductor integrated circuits have been an important enabler of this rapid evolution by offering high volume, low cost solutions with low power consumption, small footprint and reduced component count when compared to discrete or hybrid solutions. There is significant economic and business pressure to ensure that these trends continue, whilst providing increased benefits to the manufacturers including reducing the number of chips for a chip set, providing multiple standards from a single chip set, and providing specifications and margin allowing today's chip sets to support the evolving bandwidth and spectral aspects of these systems and standards.

Indeed, such wireless semiconductor circuits today address a plethora of standards including, but not limited to, IEEE 802.11 WiFi, IEEE 802.16 WiMAX, quad-band GSM, EDGE, GPRS, and Global Positioning Systems. In many instances, such as IEEE 802.16e WiMAX with targeted data rates of 10 Mb/s at a 10 km range from a base station, the systems are also stretching the limits of performance in respect of transmitted power, received power, dynamic range, interference, efficiency and bandwidth.

All of these performance aspects impact the design and implementation of the RF amplifiers that form a critical element in both the transmitter and receiver portions of the transceivers within these devices. In order to increase efficiency wireless amplifiers have tended to move from the high linearity amplifier design typified by classes A, AB, and B, (http://en.wikipedia.org/wiki/amplifier) to non-linear amplifier classes such as C, and D, where efficiencies over 90% can be achieved. Wireless devices, optionally, incorporate other classes such as E, and F for highly efficient high frequency circuits wherein switching time becomes comparable to the duty time of the amplifier.

The evolution from low efficiency, high linearity amplifiers to very high efficiency non-linear amplifiers has circuit designers exploiting classical techniques to correct the distortion generated in the amplifier. For those skilled in the art such classical techniques fall into 5 different classes; feedforward, feedback, pre-distortion, adaptive bias, and synthesis. However, the basic objective on any amplifier in the context of a wireless information transmission system is to provide an exact copy of the signal intended to be transmitted at the correct power level with highest possible power efficiency.

Feed-Forward: This approach employs an error signal that is extracted from an amplifier, commonly referred to as the power amplifier (PA) on the transmit path, and low noise amplifier (LNA) on the receive path. Considering a PA for the following discussions, then the PA is corrected by subtracting a scaled (attenuated) version of the output signal of the PA from the input signal. If these signals are properly scaled, then the resulting signal contains only error information that is spectral energy generated by the non-linearity of the PA, noise from the PA, and energy resulting from non-flat frequency response of the PA, and none of the original signal. This error signal is then amplified appropriately, and subtracted from the output signal of the PA. Typically, the output signal from the amplifier is time delayed to account for the delay in the components of the error signal generation path. An example of the feed-forward approach is disclosed by Chen et al in "Article comprising a Power Amplifier with Feed Forward Linearizer using a RLS Parameter Tracking Algorithm" (U.S. Pat. No. 5,963,091) and described in respect of FIG. 1 subsequently. If the amplitude and phase are correct, feeding forward and subtracting the error removes all the error (distortion) generated in the PA in question and is powerful in that the approach corrects any error generated by the PA. However, it is a very inefficient correction technique as firstly, the amplifier boosting the error signal must itself be fairly large and linear as its output signal is generally combined with the PA output using a low ratio coupler to avoid losses on the main transmit path. Secondly, the time delay applied to the output of the PA due to the circuit delay in the error signal path can add significant loss.

Pre-Distortion: This correction approach employs a model of the PA to predict the distortion that will be generated in the amplifier being corrected. The modeled distortion is then added to the input signal applied to the amplifier, with appropriate phase adjustment, such that it cancels the distortion produced. The model can take many forms including, but not limited to, a look-up table of amplitude modulation (AM) and phase modulation (PM) transfer curves such as AM-AM and AM-PM curves, it can be non-linear electronic hardware, it can be DSP algorithms, or it can be a scaled model of the amplifier being corrected. An example of pre-distortion applied to an amplifier is presented by Midya et al "Scalar Cost Function based Pre-Distortion Device, Method, Phone and Base Station" (U.S. Pat. No. 6,240,278), as presented and discussed in respect of FIG. 2.

Pre-distortion is an efficient technique, in that there are no lossy circuit elements after the power amplifier, and there are no additional microwave circuit blocks that are inherently power-hungry. Further, the ability to use digital hardware, which has dramatically improved in capability in recent years, has made this a favored solution. However, predistortion can only easily cope with simple memoryless deterministic distortion and typically assumes that the AM-AM and AM-PM curves are static and do not depend on earlier events, operational conditions, or frequency of operation. Furthermore, the nature of the model used to predict the error must suit the amplifier. That is, the model must employ an appropriate order of non-linearity, or an appropriate number of entries in the look-up table.

This makes the pre-distortion system somewhat specific to the amplifier being corrected. Although digital hardware tends to be relatively low cost, a digital pre-distorter can be quite elaborate, requiring wide data bus and fast sample rates (usually at least 5× the Nyquist rate of the data rate within the uncorrected signal). Finally, the algorithms for adjusting the non-linearity (the weights on the non-linear work function or the elements in the look-up table) are complex and prone to finding local minima. Despite these limitations and disadvantages, pre-distortion has a significant share of the distortion correction solutions presently implemented commercially.

Adaptive Bias: In contrast to the previous approaches, adaptive bias technique does not attempt to correct distortion products but rather can improve either the linearity or minimize the distortion of the PA. In an adaptive bias system, the bias voltages on the terminals of the active device are adjusted to suit the instantaneous signal being transmitted. For example, the collector or drain voltage of a transistor amplifier can be increased during peaks in the amplitude of the input signal. This technique can be a simple way to make modest improvements to amplifier linearity, however it also is amplifier dependant, and large improvements in linearity are difficult to achieve. As a result, the adaptive bias approach has limited benefit to the very high efficiency but highly non-linear amplifier classes that suit the demands for low power consumption in wireless handheld devices.

Synthesis: This approach is more a general category of "synthesis techniques", in which a linear PA is not used, but instead the signal at the output port of the amplification system is generated by combining 2 or more signals, each not resembling the final signal being generated. Examples of this technique include Envelope Elimination and Restoration (EE&R), as discussed by Midya, Khan et al "Method, Device, Phone and Base Station for Providing Envelope-Following for Variable Envelope Radio Frequency Signals" (U.S. Pat. No. 6,141,541), and Linear Amplification with Nonlinear Components (LINC), as discussed by Okubo et al "Constant-Amplitude Wave Combination Type Amplifier" (U.S. Pat. No. 5,287,069).

In EE&R, a constant amplitude signal with variable phase is amplified, and the envelope restored by varying the collector or drain voltage of the transistor amplifier. In LINC, two constant amplitude signals are combined in various phases to generate a signal with the correct amplitude and phase. These techniques have specific applications, but all have significant drawbacks in respect of power, bandwidth, efficiency and linearity.

Feedback: The general technique of feedback correction goes back nearly 80 years to the work of H. S. Black "Wave Translation System" (U.S. Pat. No. 2,102,671). In particular, negative feedback tends to act to reduce variability of gain, and reduces distortion introduced in an amplifier. The actual feedback may be implemented in many different forms. Perhaps the simplest form of feedback being referred to is circuit-level feedback, wherein an electrical linkage couples some of the energy from the output port of an amplifier back to the input port. Considering a single transistor amplifier, such approaches include shunt-feedback, where a resistor is placed between the drain and gate of a transistor, and series feedback, where an inductor is inserted into the source of a transistor.

Circuit level feedback can be applied to multiple stages, but the signal delay through the stages must be accounted for. If there is too much delay, then the negative feedback will, at some frequency, become positive feedback, and an oscillation results because a portion of the output signal (at a particular set of frequencies) adds constructively to the input signal. With each passage through the loop, the signal increases to the point where all energy can be found in those particular frequencies where combination is most constructive. Of course, as long as the gain is less than unity at the frequency at which the phase shift through the feedback loop is 360 degrees, the amplifier will remain stable. Simple circuit level feedback is widely used, however it suffers from one major fault in that it necessarily decreases the gain of the amplifier in order to maintain the stability condition, hence higher levels of correction necessarily cause increasing gain reduction which is particularly an issue at RF frequencies where gain is difficult and expensive to achieve.

As a result, other feedback approaches have been established to provide only the information on the envelope of the signal being amplified, which has the advantage that the RF gain of the amplifier is undiminished, and translating the feedback circuit to the baseband. Two such approaches being Cartesian Feedback and Polar Feedback. Considering, Cartesian Feedback, a typical approach is presented by Leitch "Gain/Phase Compensation for Linear Amplified Feedback Loop" (U.S. Pat. No. 4,933,986), in demodulating the signal at the output port of the amplifier into in-phase (I) and out-of-phase (Q) components in the Cartesian coordinate system. These I- and Q-output signal components can be compared to the I- and Q-input signals, and the results applied to an I/Q modulator at the input port to the amplifier to provide correction. This approach being presented subsequently in FIG. 3.

An advantage of the Cartesian feedback approach is that the filtering that keeps the amplifier stable can now be done at baseband, which is advantageous, as it no longer needs to be tuned with the RF frequency of operation of the amplifier. The design of this filter is critical however, as the filter's frequency response is superimposed onto the gain of the amplifier. Further, delay through the amplifier is critical, as it determines the bandwidth of the filter required to stabilize the feedback loop, and therefore the instantaneous bandwidth of the system.

In contrast, Polar feedback resolves the amplitude and phase elements of the output signal, compares these to the amplitude and phase characteristics of the input signal, and uses the resulting error terms to control a polar modulator placed at the input port of the power amplifier, thereby closing the loop. This approach is presented subsequently in FIG. 4. Both Cartesian and Polar feedback techniques suffer from the limitations of the loop filter that is used to ensure that the gain of the loop rolls off fast enough with increasing frequency such that the loop remains stable. In the prior art, this loop filter adds delay and amplitude variation with frequency across the band. Additionally, polar feedback exhibits an additional challenge in that the error signal bandwidth is significantly wider than the RF bandwidth.

It is possible, however, to configure feedback loops in which just the error is fed back, such an approach being presented by Huang "Wideband, Phase Compensated Amplifier with Negative Feedback of Distortion Components in the Output Signal" (U.S. Pat. No. 4,276,514). This approach generates the error term by subtracting the input signal from the attenuated version of the output signal. This error term is fed back into the input port of the amplifier in anti-phase (inverted) to effect the correction. This is advantageous, as the frequency response of the filter is now interposed only on the error signal and the main signal is not at all affected. Ripple in the frequency response of this filter will vary the amount of correction applied, but not the gain of the main signal. Implementations of error feedback have been limited, primarily as initial publications on error feedback, such as John McRory "An RF Amplifier for Low Intermodulation Distortion" (1994 MTT-S Digest, pp. 1741-1744) resulted in minimal improvements being observed. Two significant challenges in implementing this architecture exist. Firstly, the implementation of the tunable filter which must be at RF, but have a finesse adequately high to maintain stability, and secondly in designing the components in the loop to have minimal delay so that a useful correction bandwidth results.

The classical techniques presented supra all suffer from one or more of the following impairments:

Poor Efficiency
Limited Bandwidth
Complexity
Limited Effectiveness

It would be apparent that such limitations result in system designers and circuit designers trading aspects of performance and cost in implementing commercial systems with non-linear amplifiers for improved efficiency using these prior art approaches.

It would therefore be advantageous to provide a linearization solution for an RF amplifier that addresses these drawbacks of prior art approaches whilst leveraging increased integration potential within semiconductor integrated circuits for lowering cost, footprint and power consumption. It would be particularly beneficial if the linearization solution addressed the increasing fractional bandwidth of today's increasing data rate wireless protocols.

SUMMARY OF THE INVENTION

In accordance with another embodiment of the invention there is provided a method relating to an amplifier comprising providing a transmit signal, the transmit signal comprising two input signal components according to a predetermined coordinate system. This transmit signal is then provided to a microwave processor, the microwave processor comprising an input coupler for each input signal component, each input coupler for dividing the input signal component into a primary input signal component and a secondary input signal component and a vector modulator, the vector modulator operating according to the standard, the vector modulator for up-converting and combining two input signal components to form an RF signal in dependence upon at least a first oscillator signal. Additionally the microwave processor comprises an amplifier, the amplifier for amplifying at least the RF signal and providing an output signal, the output signal being a combination of an amplified replica of the RF signal and distortion generated by the amplifier, and an output coupler, the output coupler for dividing the output signal into a primary output signal and a secondary output signal.

The microwave processor further comprising a vector demodulator, the vector demodulator operating according to the coordinate system, the vector modulator for receiving and down-converting the secondary output signal and providing two secondary output signal components in dependence upon at least a second oscillator signal, and first and second summation circuits. The first summation circuit for providing each secondary input signal component and subtractively combining the secondary input signal component and respective secondary output signal component to provide an error feedback signal component. The second summation circuit for each primary input signal component and combining the primary input signal component and respective error feedback signal component to form one of the input signal components. The method controlling the microwave processor in dependence upon a measure of the error feedback signal components and reducing distortion in the output signal.

In accordance with the invention there is provided a circuit for enhancing amplification of a signal. The circuit comprising a pair of input signal ports, each input signal port for receiving an input signal component, the two input signal components comprising a transmit signal according to a predetermined standard, and output port, the output port for receiving a primary output signal, and a microwave processor, the microwave processor electrically coupled to the pair of input signal ports and output port, the microwave processor for processing the input signal components to provide the output signal.

The microwave processor itself comprising a control signal port, the control signal port for receiving a control signal, an input coupler for each input signal component, each input coupler for dividing the input signal component into a primary input signal component and a secondary input signal component, a vector modulator, the vector modulator operating according to the standard and for up-converting and combining the two input signal components to form an RF signal in dependence upon at least a first oscillator signal, an amplifier, the amplifier for amplifying at least the RF signal and providing an output signal, the output signal being a combination of an amplified replica of the RF signal and distortion generated by the amplifier, an output coupler, the output coupler for dividing the output signal into the primary output signal and a secondary output signal, the output coupler having a main port electrically coupled to at least the output port, the main port for providing the primary output signal, and a tap port, the tap port for providing the secondary output signal.

The microwave processor also comprising a vector demodulator, the vector demodulator operating according to the standard, the vector modulator for receiving and down-converting the secondary output signal and providing two secondary output signal components in dependence upon at least a second oscillator signal, a first summation circuit for each secondary input signal component, the first summation circuit for subtractively combining the secondary input signal component and respective secondary output signal component to provide an error feedback signal component; and a second summation circuit for each primary input signal component, the second summation circuit for combining the primary input signal component and respective error feedback signal component to form one of the input signal components.

The circuit also comprises a controller, the controller comprising a control port, the control port electrically coupled to the control signal port, the control port for providing the control signal, the controller generating the control signal at least in dependence upon a measure of the error feedback signal components.

In accordance with another embodiment of the invention the circuit for enhancing amplification of a signal is provided such that a first predetermined portion of the circuit is provided as a first package, the first package comprising at least a first semiconductor circuit and first package pins, and a second predetermined portion of the circuit is provided as a second package, the second package comprising at least a second semiconductor circuit and second package pins. According to the embodiment at least one of the first semiconductor integrated circuit and first package, the second semiconductor integrated circuit and second package, and the first and second packages are assembled to reduce the time delay from providing the output signal at the amplifier to providing the RF signal to the amplifier.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1:
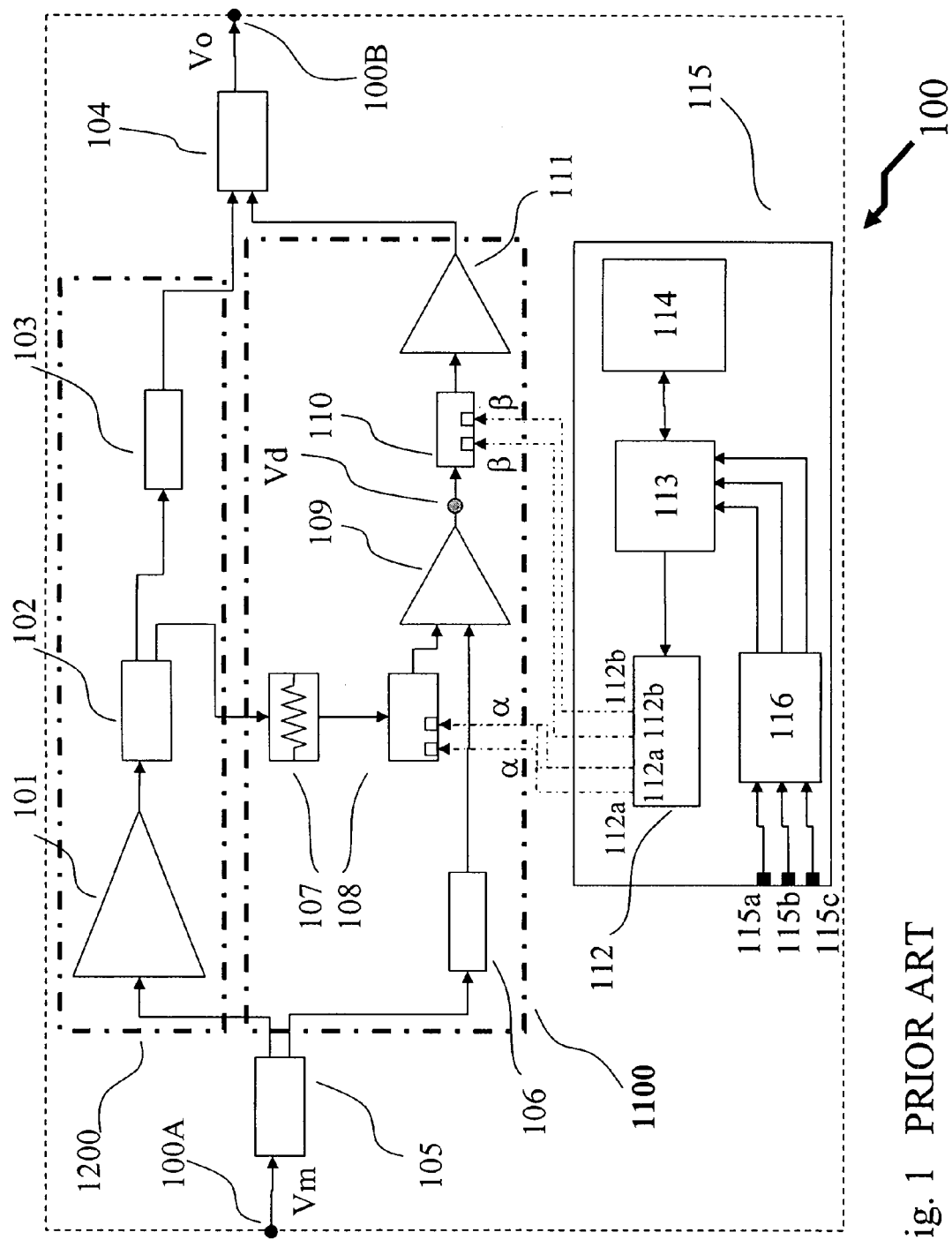
FIG. 1 illustrates an exemplary feed-forward distortion correction approach according to prior art.

Shown in FIG. 1 is an exemplary feed-forward amplifier system 100 according to Chen et al (U.S. Pat. No. 5,963,091). The feed-forward amplifier system 100 providing the required amplification in the transmit path of a wireless WiMAX transceiver embedded into a portable device, for example. As shown the feed-forward distortion correction system 100 comprises an RF input port 100A which receives an RF modulated signal Vm which is to be amplified, and provided as an amplified linear replica at the output port 100B as amplified signal Vo.

The RF input port 100A is electrically coupled to input splitter 105 which taps a predetermined portion of the RF modulated signal Vm to feed forward into the correction signal path 1100, and couples the remaining RF modulated signal Vm into the main arm 1200. The main arm 1200 couples the RF modulated signal Vm from the input splitter 105 to the power amplifier 101 which amplifies the RF modulated signal Vm as required by the overall system. The output from the power amplifier 101 is coupled to a signal splitter 102 wherein a predetermined portion of the amplified signal is tapped and coupled to the correction signal path 1100 by virtue of being electrically coupled to the attenuator 107. The remaining output signal from the signal splitter 102 is then electrically coupled to a first delay element 103 and thence to cancellation adder 104 before being electrically connected to the RF output port 100B.

The portion of the RF modulated signal Vm split from the input splitter 105 and provided to the correction signal path 1100 is initially coupled to a second delay element 106 before being coupled the first port of the adder circuit 109. The second port of the adder circuit 109 is coupled to the cancellation vector modulator 108 that receives the attenuated portion of the amplified RF signal from the attenuator 107. In this manner, the adder circuit 109 receives a time-delayed replica of the RF modulation signal Vm and a replica of the amplified signal from the power amplifier 101. As such, with appropriate control of the attenuator 107 and cancellation vector modulator 108, the portions of each replica signal can be configured to be equal magnitude and out of phase such that the adder circuit 109 provides an output signal which is solely the error introduced by the power amplifier 101, Vd.

This error signal Vd is then electrically coupled to a cancellation error vector modulator 110 and auxiliary amplifier 111, the output port of the auxiliary amplifier 111 being coupled to the other input port of the cancellation adder 104. In a similar manner to the attenuator 107 and cancellation vector modulator 108, the intent with the cancellation error vector modulator 110 and auxiliary amplifier 111 is to provide an error signal of equal magnitude to the error signal components within the main arm 1200 from the power amplifier 101, and one phase shifted such that when added to the amplified RF modulated signal within the cancellation adder 104 the error signal is cancelled, resulting in an output RF signal Vo which is a highly linear, amplified replica of the RF modulation signal V7m.

A digital signal processor 115 is configured to receive input signals determined in dependence upon the RF modulation signal Vm, output RF signal Vo and error signal Vd at its control input ports 115a through 115c. These are down-converted using down-converter circuit 116, which is configured to shift the frequency range of the signals, Vm, Vd, and Vo into the baseband frequency range. These down-converted signals are then coupled to the digital signal processor (DSP) 113, which performs the necessary calculations to determine appropriate control signals to elements of the correction signal path 1100. The DSP 113 is also in communication with memory device 114, which provides data to the DSP 113. The DSP 113 provides data to the D-A converter 112, which has DAC output port pairs 112a and 112b, each pair representing the control signals for I and Q in Cartesian modulation or magnitude and phase in polar modulation. The D-A converter 112 converts calculated parameters for the correction factors to first analog correction signals α that are coupled to the cancellation vector modulator 108 from DAC output port pair 112a, and second analog correction signals β that are coupled to the cancellation error vector modulator 110 from DAC output port pair 112b. The DSP 113 thereby monitors the RF output signal Vo, and determines adaptions to the first and second analog signals α and β.

Feed-forward correction is a powerful technique, in that it corrects any error generated by the power amplifier 101. However, the correction generated and fed forward by correction signal path 1100 must be amplified to the same power level as that of the power amplifier 101. As a result, the auxiliary amplifier 111 is typically a fairly large amplifier due to the typically low split ratio of the cancellation adder 104. This results in high power consumption. Additionally, the auxiliary amplifier must be an amplifier of high linearity as it is amplifying the correction signal, and is itself uncorrected.

Figure 2:
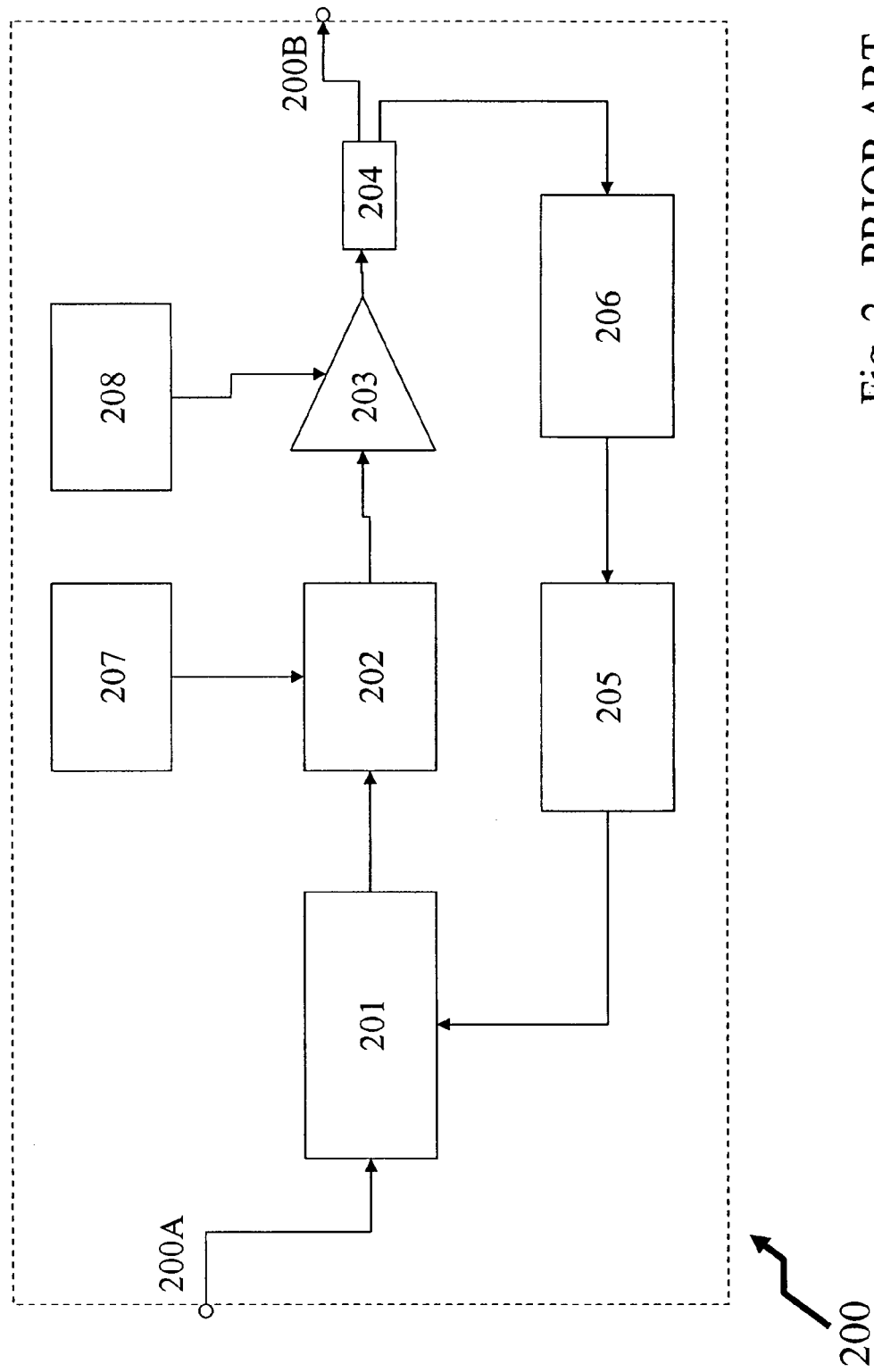
FIG. 2 illustrates an exemplary DSP based pre-distortion correction approach according to prior art.

Referring to FIG. 2 shown is an exemplary DSP pre-distortion amplifier circuit 200 according to Midya et al (U.S. Pat. No. 6,240,278). Accordingly shown is an input port 200A which receives a baseband signal to be amplified (I+jQ) which is electrically connected to a polynomial pre-distortion unit 201, the output of which is a predistorted baseband signal (I'+jQ') applied to the input port of a RF modulator 202 which translates the predistorted baseband signal to an RF input signal and couples this to the input port of the power amplifier 203. The output port of the power amplifier 203 is electrically coupled to the output port 200B via a splitter 204. The power amplifier 203 is biased from the power supply 208

The tapped portion of the amplified RF signal from the splitter 204 is electrically coupled to a scalar function generator 206, which computes a scalar out-of-band-energy function and provides this to the coefficient update unit 205. The scalar function generator 206 comprising at least an RF mixer, not shown for clarity, to convert the RF output signal to baseband for digital processing. The coefficient update unit 205 determines whether any tuning of the polynomial coefficients applied by the polynomial pre-distortion unit 201 is required, the coefficients being determined to minimize the scalar out-of-band-energy function to provide a linear amplified RF signal.

As taught by Midya et al the polynomial pre-distortion unit 201 pre-distorts the applied baseband signal using the third and fifth order terms of the non-linear component of the output signal from the amplifier, referred to as p3 and p5 respectively, which are the products of the complex baseband signal and the predetermined scalar function of the power transfer characteristic of the power amplifier 203. These terms are shown below in Eq. 1 and Eq. 2 respectively.

$$p3(I,Q)=(I+jQ)\{(I^2+Q^2)\}; \text{ and} \quad [1]$$

$$p5(I,Q)=(I+jQ)\{(I^2+Q^2)^2\} \quad [2]$$

These predetermined terms of the power series are weighted to adjust according to the given power amplifier 203, the power series coefficient weights ($w_k$) being complex. This accounts for the amplitude modulation (AM) and phase modulation (PM) nonlinearity as well as the AM-AM nonlinearity correction from the real part of the coefficients. Thus the predistortion may have the format presented below in Eq. 3.

$$(I'+Q')=(I+jQ)+w_3p_3+w_5p_5 \quad [3]$$

It is these power series coefficient weights ($w_k$) as a series of polynomial coefficients that are provided from the coefficient update unit 205 to the polynomial pre-distortion unit 201. It would be evident therefore that the polynomial pre-distortion approach requires detailed evaluation of the power amplifier 203 and derivation of the appropriate polynomial series for the correction. Hence, whilst the approach employs solely baseband digital processing, the approach can only partially account for aging effects within the power amplifier that would render the existing coefficients or polynomial less than optimal in reducing distortion. Further, variations in the voltage provided from the power supply 208, either intentionally to provide gain control, or unintentionally can result in the need for the digital circuits storing and employing multiple power series.

Since typically predistortion circuits such as DSP pre-distortion amplifier circuit 200 do not have lossy elements after the power amplifier 203, with the exception of the splitter 204, the approach is power efficient. The DSP pre-distortion amplifier circuit 200 approach disclosed by Midya et al is typical amongst predistortion circuit prior art in that it comprises an additional compensation element, namely feedback. Static pre-distortion alone is very limited and is not generally employed alone. As such, the DSP pre-distortion amplifier circuit 200 can provide some limited adjustment in correction applied with variations in the power amplifier 203 performance, these being the power series coefficient weights, $w_k$. However, such techniques can still only cope with simple memoryless deterministic distortion, employ models that assume amplification distortion curves are static, and must employ models with either appropriate order of nonlinearity or number of entries within the loop-up table to provide correction over the range of operation of the power amplifier 203.

Figure 3:
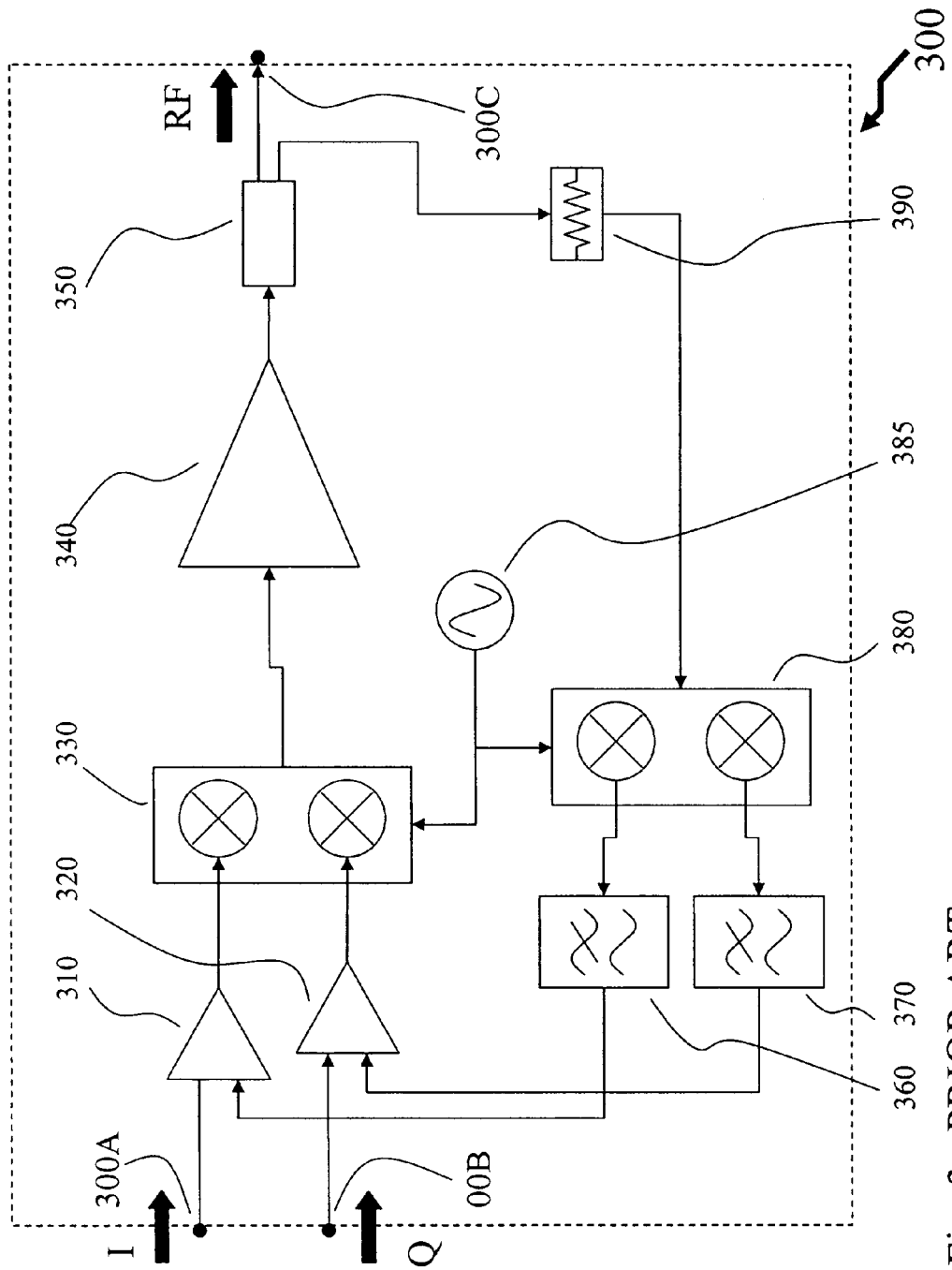
FIG. 3 illustrates an exemplary Cartesian loop feedback distortion correction approach according to prior art.

Alternative to performing feed forward or pre-distortion many have sought to provide distortion correction by directly feeding back the output signal to the input port of the power amplifier. Such an approach is presented by Haque et al (US Patent 2006/0050810) and is shown simplified in FIG. 3 as I/Q feedback circuit 300, as a prior art embodiment of the Cartesian loop feedback distortion correction approach. Coupled to the first and second input ports 300A and 300B are baseband I and Q input signals, respectively. These first and second input ports 300A and 300B are coupled to the positive ports of the first and second summing circuits 310 and 320 prior to being coupled to a vector modulator 330. The vector modulator 330, coupled to RF oscillator 385, up-converts and combines the baseband I and Q signals to form the RF signal that will be amplified by the power amplifier 340.

The output port of the power amplifier 340 is coupled to the RF output port 300C via power splitter 350. The tapped portion of the amplified RF output signal is fed via attenuator 390 to a vector demodulator 380, also coupled to the RF oscillator 385, which converts the amplified RF output signal to baseband, thereby providing amplified baseband I and Q signals respectively. The amplified baseband I signal is coupled from the vector demodulator 380 to first loop filter 360, the filtered and amplified baseband I signal then being electrically coupled to the second input port, negative port, of the first summing circuit 310. Similarly, the amplified baseband Q signal is coupled from the vector demodulator 380 to the second loop filter 370, from which the filtered and amplified baseband Q signal is then electrically coupled to the second input port, negative port, of the second summing circuit 320. In this manner, the feedback loop applies an inverted replica of the non-linear distortion for each of the in-phase and quadrature signals onto the input I and Q baseband signals such that the power amplifier provides a linearized response.

Stability of the I/Q feedback circuit 300 is achieved through the first and second loop filters 360 and 370, respectively, which are now at baseband as opposed to at RF within a conventional RF feedback loop, see for example Huang U.S. Pat. No. 4,276,514. Stability is provided by providing the first and second loop filters 360 and 370 with a frequency response that reduces the gain around the feedback loop to below unity for frequencies where the loop phase delay approaches 360 degrees, thereby reducing loop gain at those frequencies wherein loop oscillation would otherwise be established. However, the design of these loop filters 360 and 370 now becomes critical as their frequency response shapes the feedback signal applied to the first and second summing circuits 310 and 320, and is therefore directly superimposed in an amplified manner onto the output of the power amplifier 340.

Figure 4:
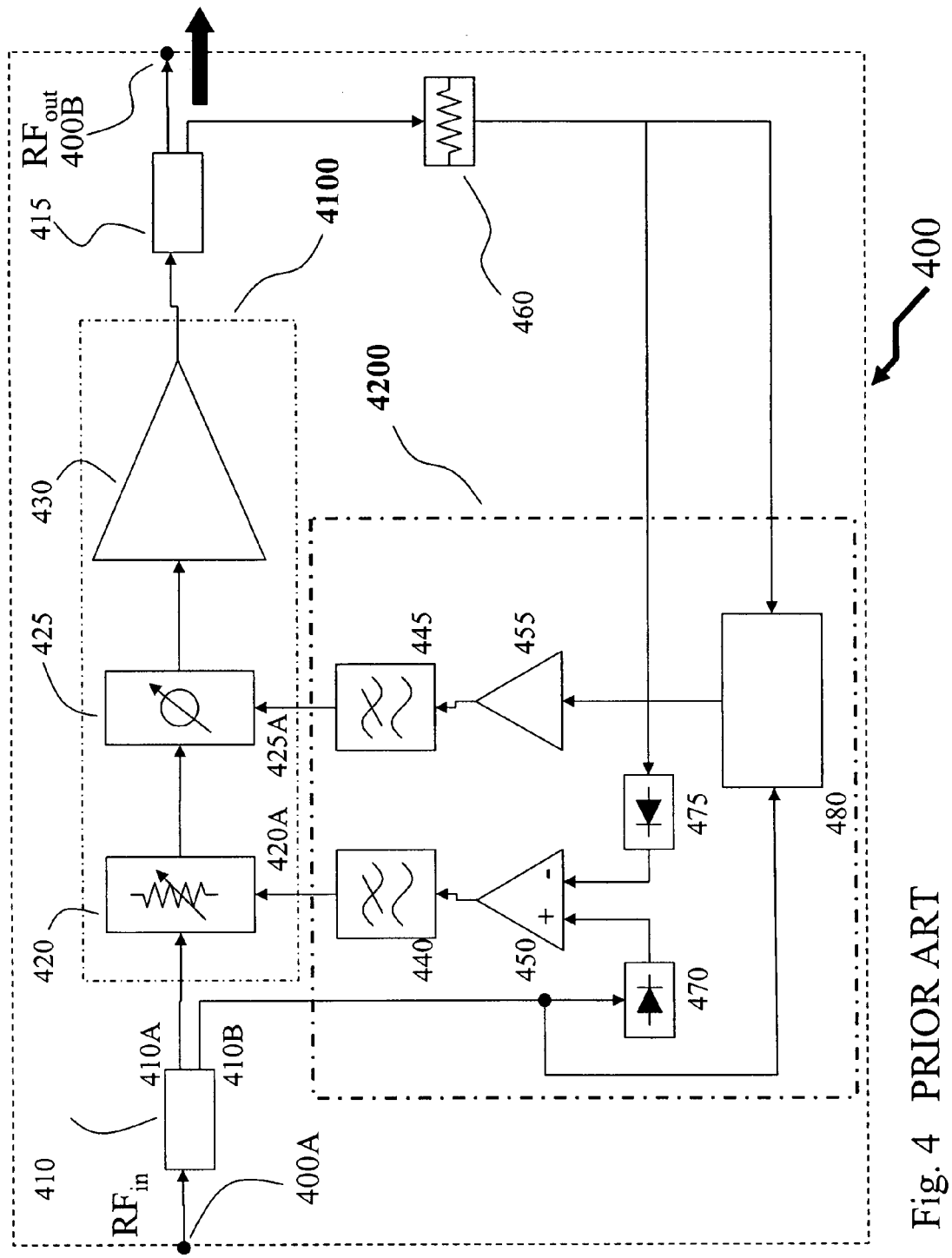
FIG. 4 illustrates an exemplary polar loop feedback distortion correction approach according to the prior art.

In respect of the loop phase, the delay through the power amplifier 340 is critical, as this therefore determines the bandwidth of the first and second loop filters 360 and 370 required to stabilize the loop. The loop filters 360 and 370 bandwidth therefore determines the instantaneous bandwidth of the I/Q feedback circuit 300. Whilst the I/Q feedback circuit 300 presented in respect of FIG. 3 operates in providing Cartesian loop feedback, some simplification and power reduction may be achieved potentially with polar loop feedback, such as shown in FIG. 4 in respect of the polar loop feedback circuit 400.

Such an approach is outlined by McNichol et al (U.S. Pat. No. 6,091,298). As shown an RF signal to be amplified, $RF_{in}$, is applied to the input port 400A of the polar loop feedback circuit 400, and is electrically connected to the input splitter 410. The primary output port 410A of the input splitter 410 is electrically connected to the main signal arm 4100, and the tap output port 410B of the input splitter 410 is electrically connected to the polar loop feedback arm 4200, and provides the first signal into the polar loop feedback arm 4200. The first signal electrically coupled from the tap output port 410B is electrically connected to the first diode detector 470 and phase comparator 480. The main signal arm 4100 comprises variable attenuator 420 and variable phase modulator 425 electrically cascaded with the primary output port 410A and the power amplifier 430. The output port of the power amplifier 430 is then electrically connected to the output splitter 415. The output splitter 415 is electrically coupled to the output port 400B, thereby providing the amplified RF output signal, $RF_{out}$. The second port of the output splitter 415 provides the second signal into the polar loop feedback arm 4200.

The second port of the output splitter 415 is electrically connected to the feedback attenuator 460, the output of which is electrically connected to the second diode detector 475 and phase comparator 480. The output signals from the first and second diode detectors 470 and 475 are electrically connected to the positive and negative input ports of differential amplifier 450, the output of which is electrically coupled to the control port 420A of the variable attenuator via the first loop filter 440. As the first diode detector 470 detects the received RF signal $RF_{in}$, and the second diode detector 475 detects the amplified RF output signal $RF_{out}$, the output from the differential amplifier 450 is directly determined by the error introduced by the power amplifier 430.

The output signal of the phase comparator 480 is electrically connected to the control amplifier 455, and thence to the control port 425A of the variable phase modulator 425 via the second loop filter 445. As a result, the phase comparator 480 and differential amplifier 450, in conjunction with first and second diode detectors 470 and 475, provide for independent control of the amplitude and phase of the RF signal $RF_{in}$ immediately prior to the power amplifier 430. In this manner, the polar loop feedback arm 4200 provides correction of the distortion introduced by power amplifier 430.

Figure 5:
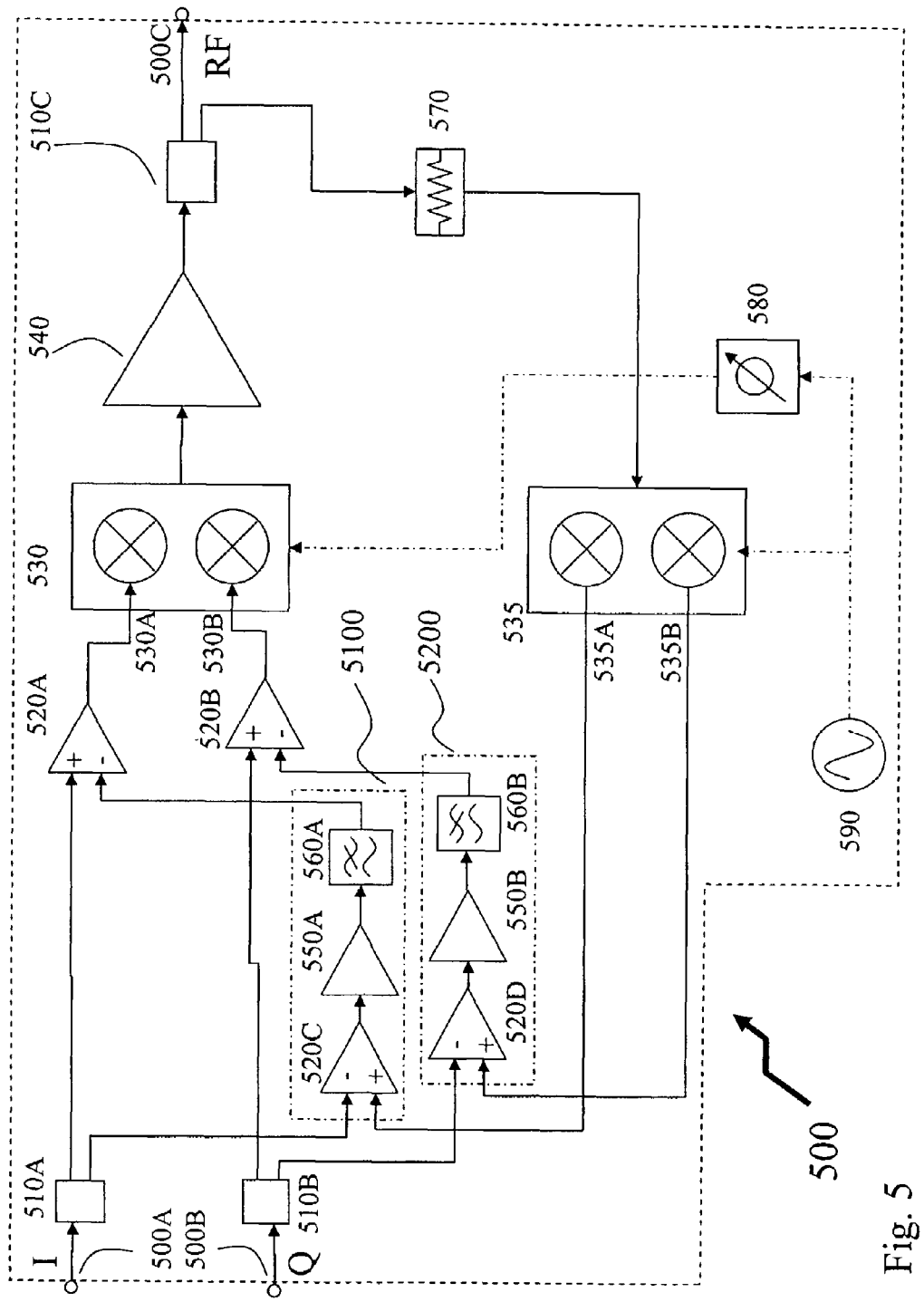
FIG. 5 illustrates a first exemplary embodiment of the invention providing distortion correction by I and Q baseband signal feedback.

Referring to FIG. 5 there is illustrated a Cartesian error feedback circuit 500 according to a first exemplary embodiment of the invention for providing distortion correction by baseband signal feedback. First input port 500A receives an in-phase (I) baseband signal and is electrically connected to in-phase splitter 510A, the main output port of which is electrically connected to in-phase port 530A of the vector modulator 530 via the first error summation node 520A, the tap output port is electrically connected to the in-phase error generator circuit 5100 at the negative port of third summation node 520C. The second input port 500B receives a quadrature (Q) baseband signal and is electrically connected to in-phase splitter 510B, the main output port of which is electrically connected to quadrature port 530B of the vector modulator 530 via the second error summation node 520B, the tap output is electrically connected to the quadrature error generator circuit 5200 at the negative port of fourth summation node 520D.

The output signal of the vector modulator 530, which is the RF signal to be amplified, is electrically coupled to the input port of the power amplifier 540 wherein it is amplified and electrically coupled to the output power splitter 510C, where the main output port is electrically coupled to the output port 500C and provides the output amplified signal RF. The tap port of the output power splitter 510C is electrically coupled to the attenuator 570, and then to the vector demodulator 535. The vector demodulator output ports 535A and 535B are electrically coupled to the in-phase and quadrature error generator circuits 5100 and 5200 respectively. The first output port 535A provides the amplified in-phase baseband signal to the in-phase error generator circuit 5100, wherein it is electrically connected to the positive port of third summation node 520C. Similarly, the second output port 535B provides the amplified quadrature phase baseband signal to the quadrature error generator circuit 5200, wherein it is electrically connected to the positive port of the fourth summation node 520D.

The third summation node 520C receives the tapped in-phase baseband signal from the first input splitter 510A and the down-converted amplified in-phase baseband signal from vector demodulator 535, and provides at its output the difference in these signals, which represents the in-phase error component of the amplified signal, RF, from the power amplifier 540. This in-phase error component is then coupled via first error amplifier 550A and first error loop filter 560A prior to being combined with the in-phase baseband signal at first error summation node 520A. In this manner, the in-phase baseband signal applied to the in-phase port 530A of the vector modulator 530 is corrected for distortion resulting from the amplification within the power amplifier 540 that affects the in-phase component of the RF signal to be amplified.

Similarly, the fourth summation node 520D receives the tapped quadrature baseband signal from the second input splitter 510B and the down-converted amplified quadrature baseband signal from vector demodulator 535, and provides at its output the difference in these signals, which represents the quadrature error component of the amplified signal, RF, from the power amplifier 540. This quadrature error component is then coupled via second error amplifier 550B and second error loop filter 560B prior to being combined with the quadrature baseband signal at second error summation node 520B. In this manner, the quadrature baseband signal applied to the quadrature port 530B of the vector modulator 530 is corrected for distortion resulting from the amplification within the power amplifier 540 that affects the quadrature component of the RF signal to be amplified.

The vector demodulator 535 providing the down-converted amplified in-phase and quadrature baseband signals receives the RF oscillator signal for the down-conversion process of the tapped RF output from signal oscillator 590. The signal oscillator 590 also provides the RF oscillator signal for the up-conversion within the vector modulator 530, but is electrically connected via a phase shifter 580. Appropriate adjustment of phase shifter 580 results in the vector demodulator 535 providing the correct I and Q output signals.

As outlined supra, the Cartesian error feedback circuit 500 generates for each of the I and Q paths an error signal, generated in summation nodes 520C and 520D, which is amplified, by error amplifiers 550A and 550B, filtered, by error loop filters 560A and 560B, and inverted wherein it is applied through summation nodes 520A and 520B to provide the input signals to the vector modulator 530. By inverted, we mean that the signal undergoes a 180 degree phase shift. According therefore to conventional feedback theory if the phase of the feedback loop is 180 degrees, the degree of suppression of the unwanted components is equal to the loop gain. So, if, for example, the loop gain is 20 dB, then 20 dB of suppression can be expected due to the action of the feedback. One of the challenges in this architecture is maintaining the 180 degree phase shift in the loop, and avoiding the criterion for oscillation, namely 360 degrees of phase shift with more than unity gain.

Fulfilling high loop gain, for high distortion suppression, whilst avoiding oscillation is challenging, as will be evident to one skilled in the art, because the amplifier may have several stages, and narrow band matching, so that the phase through the amplifier changes quickly with frequency, in other words, the amplifier may have significant delay. As such, the error loop filters 560A and 560B cause the loop gain to fall rapidly with frequency, so that the gain is less than unity when the phase shift has reached 0 degrees. However, unlike prior art solutions these error loop filters 560A and 560B are only filtering the baseband error signal generated within the in-phase error generator circuit 5100 and quadrature error generator circuit 5200 respectively. As a result the critical design aspect of this filter shifts from flatness of frequency response to the provisioning of sharp cut-off allowing high suppression below cut-off and rapid reduction in gain above this.

Additionally, to successfully configure this amplifier, it is advantageous to minimize the total loop gain so that the error loop filters 560A and 560B can be provided with wide bandwidth since a wide loop filter allows correction over a wide bandwidth of signal, and maintain the loop gain sufficiently large enough to effect mid-band correction. This is particularly important with WiMAX and WiFi applications where channel bandwidths of 10 MHz and 20 MHz are desired respectively, such wide bandwidths thereby limiting overall loop delay. Benefit provided by the Cartesian error feedback circuit 500 increases according to the design attention in respect of minimizing this loop delay.

Whilst the exemplary embodiment of the invention has been presented with respect to a Cartesian error feedback method, alternatively other coordinate systems for the provision of baseband signals may be employed. As such, the error feedback approach of the invention may be applied to polar coordinate modulation formats, and optionally arbitrary coordinate modulation formats.

With WiMAX subscriber units having over 50 dB of dynamic range in output power, the PA within such units will typically operate from very low gain and output power, wherein the main power amplifier is typically relatively linear, to high gain and high output power wherein it is typically highly non-linear. As such, there is benefit in operating the Cartesian error feedback circuit 500 in two modes of operation according to output power. Optionally, these modes are switched according to other aspects of the system within which the Cartesian error feedback circuit 500 is embedded, such as for managing power consumption in handheld devices. At high output powers, with highly non-linear amplifier characteristics the Cartesian error feedback circuit 500 operates as presented in the embodiment of FIG. 5. At low output powers where the power amplifier 540 has typically significantly improved linearity the in-phase error generator circuit 5100 and quadrature error generator circuit 5200, along with the vector demodulator 535 can be disabled by removing applied electrical power, such that the Cartesian error feedback circuit 500 now operates in open-loop but with reduced power consumption.

Figure 6:
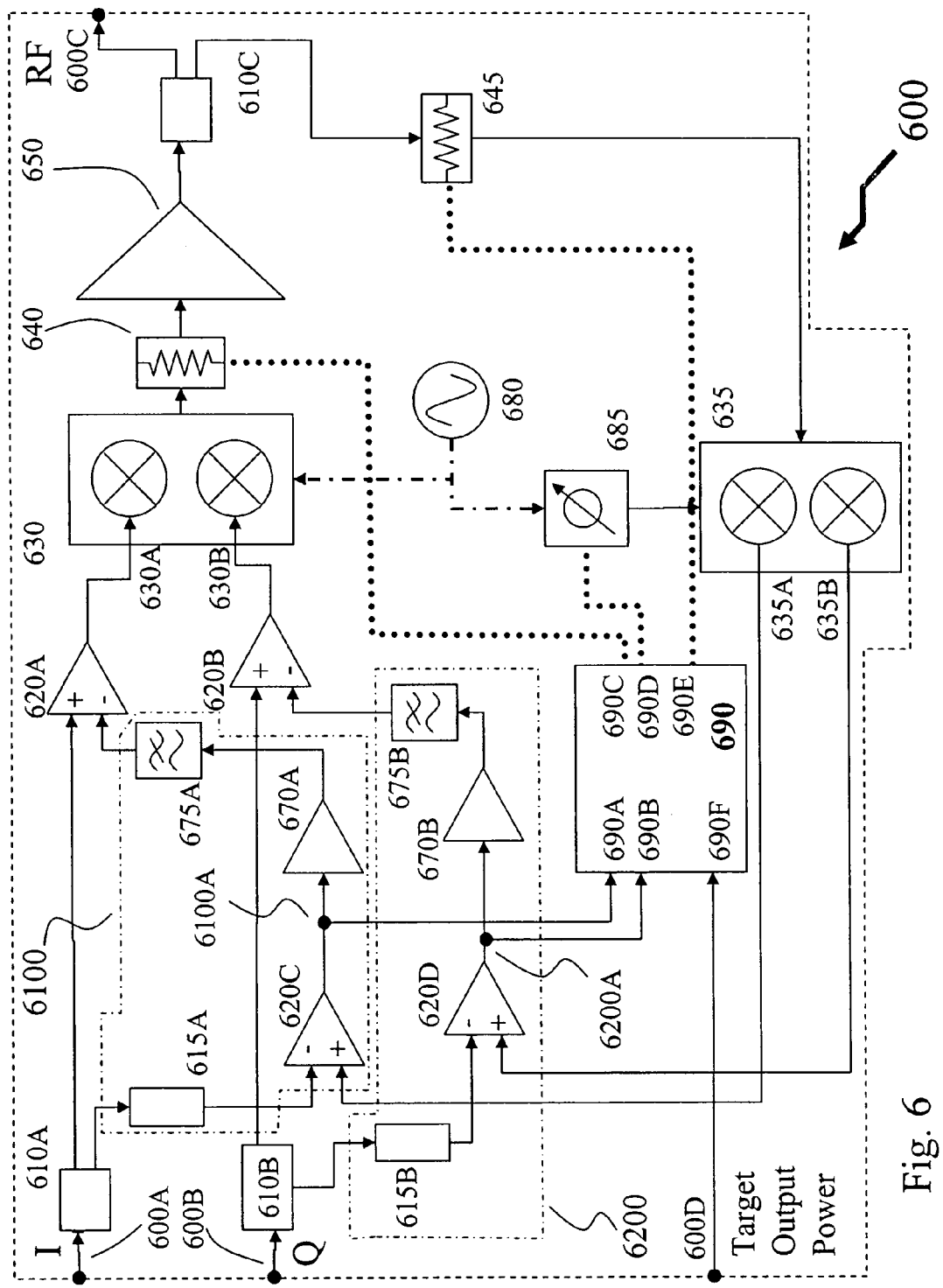
FIG. 6 illustrates a second exemplary embodiment of the invention with I and Q baseband feedback operating over wide dynamic range and continuous control.

Referring to FIG. 6 illustrated is a second exemplary embodiment of the invention for a Cartesian error feedback circuit 600 employing I and Q baseband feedback and operating over wide dynamic range and providing continuous control. As shown, a first input port 600A receives an in-phase (I) baseband signal and is electrically connected to in-phase splitter 610A, the main output port of which is electrically connected to in-phase port 630A of the vector modulator 630 via the first error summation node 620A, the tap output port is electrically connected to the in-phase error generator circuit 6100 at in-phase delay circuit 615A and thereafter to the negative port of third summation node 620C. The second input port 600B receives a quadrature (Q) baseband signal and is electrically connected to in-phase splitter 610B, the main output port of which is electrically connected to quadrature port 630B of the vector modulator 630 via the second error summation node 620B, the tap output port is electrically connected to the in-phase error generator circuit 6200 at quadrature delay circuit 615B and thereafter the negative port of fourth summation node 620D.

The delay circuits 615A and 615B are not essential, but are advantageous to the implementation of the design. The delay of these elements should be designed to approximately match the delay from splitters 610A and 610B to the negative input port of third and fourth summation nodes 620C and 620D via the forward and reverse paths comprising elements 620A, 620B, 630, 640, 650, 610C, 645 and 635. This means that the waveforms at the positive and negative input port of third summation node 620C and fourth summation node 620D are approximately time aligned. This condition achieves greater cancellation of the wanted signal power over a wider bandwidth than if the delay circuits 615A and 615B had zero delay or were omitted, minimizing the error signal power at tap points 6100A and 6200A and reducing the dynamic range requirements on the components in the error generator circuits 6100 and 6200.

The output signal of the vector modulator 630 is therefore the RF signal to be amplified and this is electrically coupled to the input port of the power amplifier 650 via power attenuator 640 wherein it is amplified and electrically coupled to the output power splitter 610C. The main output port is electrically coupled to the output port 600C and provides the amplified output signal, RF. The tap port of the output power splitter 610C is electrically coupled to the tap attenuator 645, and then to the vector demodulator 635. The vector demodulator two output ports 635A and 635B are electrically coupled to the in-phase and quadrature error generator circuits 6100 and 6200, respectively. The first output port 635A provides the amplified in-phase baseband signal to the in-phase error generator circuit 6100, wherein it is electrically connected to the positive port of third summation node 620C. Similarly, the second output port 635B provides the amplified quadrature phase baseband signal to the quadrature error generator circuit 6200, wherein it is electrically connected to the positive port of the fourth summation node 620D. Importantly, stability and control of the feedback loop are enhanced over wide output power ranges of operation by linking the control of the power attenuator 640 and tap attenuator 645. As the output power setting of the Cartesian error feedback circuit 600 reduces, the feedback loop seeks to maximize gain, whereas according to the embodiment presented in respect of FIG. 6 the tap attenuator 645 is optionally adjusted inversely to power attenuator 640 such that the signal power fed into the error loop is sustained at a constant level. Optionally, the attenuators may be replaced with variable gain amplifier elements.

Accordingly, the third summation node 620C receives the tapped in-phase baseband signal from the first input splitter 610A and the down-converted amplified in-phase baseband signal from vector demodulator 635, and therefore provides at its output port the difference in these signals, which represents the in-phase error component of the amplified signal, RF, from the power amplifier 650. This in-phase error component is then coupled via first error amplifier 670A and first error loop filter 675A prior to being combined with the in-phase baseband signal at first error summation node 620A. This results in the in-phase baseband signal applied to the in-phase port 630A of the vector modulator 630 having correction applied for distortion resulting from the amplification within the power amplifier 650.

In the same manner, the fourth summation node 620D receives the tapped quadrature baseband signal from the second input splitter 610B and the down-converted amplified quadrature baseband signal from vector demodulator 635. Thus fourth summation node 620D provides at its output port the difference in these signals, which represents the quadrature error component of the amplified signal, RF, from the power amplifier 650. This quadrature error component is then coupled via second error amplifier 670B and second error loop filter 675B prior to being combined with the quadrature baseband signal at second error summation node 620B. This results in the quadrature baseband signal applied to the quadrature port 630B of the vector modulator 630 having a correction applied for the distortion resulting from the amplification within the power amplifier 650.

The vector modulator 630 providing up-conversion of the in-phase and quadrature signals, applied at in-phase and quadrature ports 630A and 630B respectively, receives the RF oscillator signal for this up-conversion from the signal oscillator 680. This signal oscillator 680 also provides the RF oscillator signal for the vector demodulator 635 such that the vector demodulator provides the down-converted amplified in-phase baseband signal and down-converted amplified quadrature baseband signal at first and second output ports 635A and 635B respectively. However, rather than direct electrical connection from the signal oscillator 680 to the vector demodulator 635 the RF oscillator signal is applied via oscillator phase shifter 685 which provides control of the phase of the RF oscillator signal applied to the vector demodulator 635.

The control signal for the oscillator phase shifter 685 is provided from the oscillator control port 690D of an error loop feedback controller circuit 690. The error loop feedback controller circuit 690 determines appropriate control signals in dependence upon the in-phase error component of the amplified signal as determined at in-phase tap point 6100A after the third summation node 620C, which is electrically coupled to in-phase measurement port 690A of the error loop feedback controller circuit 690, and the quadrature error component of the amplified signal as determined at quadrature tap point 6200A after the fourth summation node 620D, which is electrically coupled to the quadrature measurement port 690B of the error loop feedback controller circuit 690.

Accordingly, in this exemplary embodiment operation of the amplifier error feedback via in-phase error generator circuit 6100 and quadrature error generator circuit 6200 is based upon nulling the magnitude of the signals measured at in-phase tap point 6100A and quadrature tap point 6200A. Advantageously, this control implementation allows the error loop feedback controller circuit 690 to provide continuous adjustment of the in-phase error generator circuit 670A and quadrature error generator circuit 670B during operation of the power amplifier 650 as part of the Cartesian error feedback circuit 600.

The error loop feedback controller circuit 690 receives at power control port 690F an input signal in dependence upon the operating output power of the Cartesian error feedback circuit 600 as provided at control input 600D, and provides control signals at first and second power control ports 690C and 690E to the power attenuator 640 and tap attenuator 645 respectively. Similarly, the I and Q error signals are amplified by error loop amplifiers 670A and 670B, which may be implemented as fixed gain elements or optionally be variable gain amplifiers to facilitate the alignment of the loop without the risk of instability.

The Cartesian error feedback circuit 600 has the same advantages as the embodiment presented and described in respect of FIG. 5 in that the error loop filters 675A and 675B are applied only to the error signal and not the signal for transmission. The frequency response of these filters is not particularly important, but the aspect that they roll-off the loop gain such that there is phase margin at the frequency where loop gain reaches unity is important.

As presented supra the main requirement for the power amplifier 650 is that its delay is kept low. Linearity is not particularly important, and in general will be traded in favor of amplifier efficiency. The amplifier could be class A, class AB, Class B, class C, class E or Class F, or any other class of operation, unlike prior art approaches which are typically suited to a smaller subset of the available amplifiers.

In operation the Cartesian error feedback circuit 600 operates by adjusting the phase of phase shifter 685, which offsets the phase of down-converted I and Q baseband signals at ports 635A and 635B of the vector demodulator 635, and adjusting the amplitude of the feedback signal using power attenuator 640 and tap attenuator 645, the error signal at the output port of the third and fourth summations nodes 620C and 640D, respectively, is optionally made to consist only of distortion, and the wanted signal can be nulled out. As shown within the embodiment of FIG. 6 these error signals from third and fourth summations nodes 620C and 640D, respectively, are monitored by error loop feedback controller circuit 690 to indicate the effectiveness of the null, and the amount of error being generated by the main amplifier 650. Optionally, error loop feedback controller circuit 690 is used in conjunction with other circuitry or algorithms to align the error loop.

Since the error loop feedback controller circuit 690 receives the I and Q error signals and seeks to establish nulling of these I and Q error signal magnitudes, the error loop feedback controller circuit 690 can operate continuously during transmission of live traffic, that is data transmission in the normal course and not in the context of system calibration or trial modes. In accordance with other prior art, such as taught by Gailus et al (U.S. Pat. No. 5,066,923), establishing the operating point of the feed-back loop cannot be undertaken directly from the detected feedback signals. Instead, Gailus et al teaches to injecting pilot tones and other control signals into the feed-back loop during periods of the time wherein the PA is not carrying live traffic, and holding the established operating point constant during the subsequent burst transmission of live data. The exemplary embodiment of the invention in contrast provides a significant enhancement over this prior art in allowing systems incorporating the invention to transmit continuously, for example in the absence of other transmitters. Further, such continuous feed-back allows enhanced performance as the device within which the PA is part switches from one base station to another, sometimes resulting in large shifts in the output power from one cell to another, as occurs with highly mobile transceivers.

Whilst the embodiment presented supra allows nulling of the error signal to be performed during continuous operation of the system, adjustments may be also be made during null timeslots, guard bands and other parts of the modulation signals provided to the Cartesian error feedback circuit 600 without restricting control adjustment to those periods of time where the transmitter is idle. In these alternate time intervals, other techniques may be used to align the system, for example reducing the gains of the error loop amplifiers 620C and 620D, and injecting a signal in the I input port 600A, and adjusting the phase shifter 685 until there is no Q signal at the output 635B of down-converter 635. Alternatively, the signal could be injected into Q input port 600B and adjusting the phase shifter 685 until there is no I signal at the output port 635A of down-converter 635, or no ongoing adjustment is performed wherein the control signals are maintained at their settings at the end of the preceding event of transmitting live traffic.

The exemplary embodiment of the Cartesian error feedback circuit 600 above provides control of the phase shift 685, control of the attenuation before the power amplifier 650 via power attenuator 640, and power control in the tap arm via the tap attenuator 645 from the error loop feedback controller circuit 690. Optionally, the error loop feedback controller circuit 690 provides only control of some of these circuit elements, or alternatively provides additional control such as providing control of the phase of the local oscillator 680 applied to the vector modulator 630. Additionally, the controller may establish updates to different control loops at different rates, such as providing frequent updates of the phase of the local oscillator 680 applied to the vector modulator 630 and vector demodulator 635 and infrequent updates to the power attenuator 640 and tap attenuator 645.

Optionally, the error loop feedback controller 690 receives additional control input signals such as a transmit enable, therein providing the error loop feedback controller 690 with information as to status of the transmitter to which the Cartesian error feedback circuit 600 is connected. This information allowing timing for controlling adjustment triggers, implementing adjustments of power level, or enabling the provisioning of a dedicated test signal such as outlined supra to be established by the error loop feedback controller 690.

Numerous other embodiments may be envisaged without departing from the spirit or scope of the invention.

What is claimed is:

1. A method comprising;
   providing a transmit signal, the transmit signal comprising two input signal components according to a predetermined coordinate system;
   providing a microwave processor, the microwave processor comprising;
      providing an input coupler for each input signal component, each input coupler for dividing the input signal component into a primary input signal component and a secondary input signal component;
      providing a vector modulator, the vector modulator operating according to the standard, the vector modulator for up-converting and combining two input signal components to form an RF signal in dependence upon at least a first oscillator signal;
      providing an amplifier, the amplifier for amplifying at least the RF signal and providing an output signal, the output signal being a combination of an amplified replica of the RF signal and distortion generated by the amplifier;
      providing an output coupler, the output coupler for dividing the output signal into a primary output signal and a secondary output signal;
      providing a vector demodulator, the vector demodulator operating according to the coordinate system, the vector modulator for receiving and down-converting the secondary output signal and providing two secondary output signal components in dependence upon at least a second oscillator signal;
      providing a first summation circuit for each secondary input signal component, the first summation circuit for subtractively combining the secondary input signal component and respective secondary output signal component to provide an error feedback signal component; and
      providing a second summation circuit for each primary input signal component, the second summation circuit for combining the primary input signal component and respective error feedback signal component to form one of the input signal components;
   wherein, controlling the microwave processor in dependence upon a measure of the error feedback signal components is for reducing distortion in the output signal.

2. A method according to claim 1 wherein,
   controlling the microwave processor in dependence upon a measure of the error feedback signal comprises determining the measure of the error feedback signal components when the transmit signal represents live traffic.

3. A method according to claim 1 wherein,
   controlling the microwave processor in dependence upon a measure of the error feedback signal comprises determining the measure of the error feedback signal components in dependence upon a mode of operation.

4. A method according to claim 3 wherein,
   determining a mode of operation comprises determining a first mode of operation when processing live traffic, and determining a second mode of operation when other than processing live traffic.

5. A method according to claim 4 wherein,
   controlling the microwave processor in the second mode of operation comprises providing at least one of maintaining the microwave processor at a setting established during the first mode of operation and controlling the microwave processor by providing a predetermined baseband test signal as one input signal component and determining a measure of the other error feedback signal.

6. A method according to claim 1 comprising;
   enabling a predetermined portion of the microwave processor in a first mode of operation; and,
   disabling the predetermined portion of the microwave processor in a second mode of operation.

7. A method according to claim 6 wherein,
   the predetermined portion of the microwave processor comprises at least one of the vector demodulator and first summation circuit.

8. A method according to claim 6 wherein,
   determining the mode of operation comprises determining the mode of operation in dependence of at least one of a target output power of the output signal and a target power consumption of the microwave processor.

9. A method according to claim 1 comprising,
   providing an oscillator circuit, comprising;
      providing an oscillator, the oscillator providing a reference oscillator signal;
      providing a phase adjuster, the phase adjuster providing an adjusted reference oscillator signal, the adjusted reference oscillator signal being a phase shifted replica of the reference oscillator signal and the magnitude of the phase shift being determined in dependence of the measure of the error feedback signal components;
   wherein, one of the first oscillator signal and second oscillator signal is the reference oscillator signal and the other of the first oscillator signal and second oscillator signal is the adjusted reference oscillator signal.

10. A method according to claim 1 comprising,
    providing a first power management circuit, the first power management circuit for adjusting the power level of the RF signal; and
    providing a second power management circuit, the second power management circuit for adjusting the power of the secondary output signal.

11. A method according to claim 10 wherein;
    providing the first and second power management circuits adjust the powers of the RF signal and secondary output signal according to a predetermined relationship.

12. A method according to claim 11 wherein;
providing the first and second power management circuits maintains a constant power level of the secondary output signal provided to the vector demodulator.

13. A method according to claim 1 wherein,
controlling the microwave processor comprises minimizing the measure of the error feedback signal components.

14. A method according to claim 1 wherein,
providing the transmit signal comprises providing two baseband signals according to a modulation format, the modulation format being at least one of quadrature modulation and polar modulation.

15. A method according to claim 1 comprising;
providing a processing element for each error feedback signal component, the processing element providing for at least one of shifting the phase, adjusting the amplitude, applying a time delay, and filtering the error feedback signal component.

16. A method according to claim 15 wherein,
filtering the baseband error signal component comprises filtering with a low pass filter.

17. A method according to claim 16 wherein,
filtering with a low pass filter comprises providing a low pass filter characterized by at least a cutoff frequency, wherein the cutoff frequency multiplied by the time delay from an output port of the amplifier to an input port of the amplifier is less than is 25 MHz.ns.

18. A method according to claim 1 wherein,
providing an input coupler comprises providing a delay circuit, the delay circuit for applying a predetermined time delay to the secondary input signal component, the predetermined time delay being approximately equal to the time delay from generating the primary input signal to generating the error feedback signal.

19. A method according to claim 1 wherein,
providing the microwave processor comprises providing at least a semiconductor integrated circuit.

20. A method according to claim 1 comprising;
providing a first predetermined portion of the microwave processor as a first semiconductor integrated circuit;
providing a second predetermined portion of the microwave processor as a second semiconductor integrated circuit; and,
assembling the first and second semiconductor integrated circuits to reduce the time delay from providing the output signal at the amplifier to providing the RF signal to the amplifier.

21. A method according to claim 1 comprising;
providing a first predetermined portion of the microwave processor as a first package, the first package comprising at least a first semiconductor circuit and first package pins;
providing a second predetermined portion of the microwave processor as a second package, the second package comprising at least a second semiconductor circuit and second package pins; and,
assembling at least one of the first semiconductor integrated circuit and first package, the second semiconductor integrated circuit and second package, and the first and second packages to reduce the time delay from providing the output signal at the amplifier to providing the RF signal to the amplifier.

22. A method according to claim 21 wherein,
assembling the first and second packages comprises providing placement of at least one of first package pins within the first package and second package pins within the second package to reduce a measure of the length of the electrical connections between the first and second packages.

23. A circuit comprising;
a pair of input signal ports, each input signal port for receiving an input signal component, the two input signal components comprising a transmit signal according to a predetermined standard;
an output port, the output port for receiving a primary output signal;
a microwave processor, the microwave processor electrically coupled to the pair of input signal ports and output port, the microwave processor for processing the input signal components to provide the output signal, the microwave processor comprising;
 a control signal port, the control signal port for receiving a control signal;
 an input coupler for each input signal component, each input coupler for dividing the input signal component into a primary input signal component and a secondary input signal component;
 a vector modulator, the vector modulator operating according to the standard and for up-converting and combining the two input signal components to form an RF signal in dependence upon at least a first oscillator signal;
 an amplifier, the amplifier for amplifying at least the RF signal and providing an output signal, the output signal being a combination of an amplified replica of the RF signal and distortion generated by the amplifier;
 an output coupler, the output coupler for dividing the output signal into the primary output signal and a secondary output signal, the output coupler having a main port electrically coupled to at least the output port, the main port for providing the primary output signal, and a tap port, the tap port for providing the secondary output signal;
 providing a vector demodulator, the vector demodulator operating according to the standard, the vector modulator for receiving and down-converting the secondary output signal and providing two secondary output signal components in dependence upon at least a second oscillator signal;
 a first summation circuit for each secondary input signal component, the first summation circuit for subtractively combining the secondary input signal component and respective secondary output signal component to provide an error feedback signal component; and
 a second summation circuit for each primary input signal component, the second summation circuit for combining the primary input signal component and respective error feedback signal component to form one of the input signal components; and,
a controller, the controller comprising a control port, the control port electrically coupled to the control signal port, the control port for providing the control signal, the controller generating the control signal at least in dependence upon a measure of the error feedback signal components.

24. A circuit according to claim 23 wherein,
the controller comprises an operating mode port, the operating mode port for receiving a mode signal; and the controller generates the control signal at least in dependence upon the mode signal.

25. A circuit according to claim 24 wherein,
a first mode control signal is provided to the controller when the microwave processor is operating in a first mode, and,
a second mode control signal is provided to the controller when the microwave processor is operating in a second mode.

26. A circuit according to claim 25 wherein,
the first mode of operation is established when the transmit signal comprises live traffic; and,
the second mode of operation is established when the transmit signal comprises at least one of other than live traffic and a predetermined null of content within live traffic.

27. A circuit according to claim 26 wherein,
generating the control signal in the second mode operation comprises at least one of maintaining the control signal as setting established during the first mode of operation and generating the control signal in response to providing a predetermined baseband test signal as one input signal component and determining the measure of the other error feedback signal.

28. A circuit according to claim 23 comprising;
enabling a predetermined portion of the circuit in a first mode of operation; and,
disabling the predetermined portion of the circuit in a second mode of operation.

29. A circuit according to claim 28 wherein,
the predetermined portion of the circuit comprises at least one of the vector demodulator, controller, and first summation circuit.

30. A circuit according to claim 29 wherein,
determining the one of first mode and second mode of operation comprises determining the one of first mode and second mode of operation at least in dependence upon at least one of a target output power of the circuit and a target power consumption of the microwave processor.

31. A circuit according to claim 23 comprising,
an oscillator circuit, the oscillator circuit for providing the first and second oscillator signals and comprising;
 an oscillator, the oscillator providing a reference oscillator signal;
 a phase adjuster, the phase adjuster providing an adjusted reference oscillator signal, the adjusted reference oscillator signal being a phase shifted replica of the reference oscillator signal and the magnitude of the phase shift being determined in dependence of the measure of the error feedback signal components;
wherein, one of the first oscillator signal and second oscillator signal is the reference oscillator signal and the other one of the first oscillator signal and second oscillator signal is the adjusted reference oscillator signal.

32. A circuit according to claim 23 comprising,
a first power management circuit, the first power management circuit electrically coupled between the amplifier and vector modulator, the first power management circuit for adjusting the power level of the RF signal; and,
a second power management circuit, the second power management circuit electrically coupled between the tap port of the output coupler and vector demodulator for adjusting the power of the secondary output signal.

33. A circuit according to claim 32 wherein;
the first and second power management circuits adjust the powers of the RF signal and secondary output signal according to a predetermined relationship.

34. A circuit according to claim 33 wherein;
the first and second power management circuits maintain a constant power level of the secondary output signal as provided to the vector demodulator.

35. A circuit according to claim 23 wherein,
the controller in generating the control signal seeks to lower the measure of the error feedback signal components.

36. A circuit according to claim 35 wherein,
lowering the measure of the error feedback signal components at least one of reduces distortion within the output signal and increases linearity of the amplifier.

37. A circuit according to claim 23 wherein,
providing the two input signal components comprises providing two baseband signals according to a modulation standard, the modulation standard being at least one of quadrature modulation and polar modulation.

38. A circuit according to claim 23 comprising;
a processing element for each error feedback signal component, the processing element electrically disposed between the first and second summation circuits and providing for at least one of shifting the phase, adjusting the amplitude, applying a time delay, and filtering the error feedback signal component.

39. A circuit according to claim 38 wherein,
filtering the error feedback signal component comprises filtering the error feedback signal component with at least a low pass filter, the low pass filter characterized by at least a cutoff frequency.

40. A circuit according to claim 39 wherein,
the cutoff frequency of the low pass filter specified in MHz multiplied by the time delay specified in ns from generating the output signal from the amplifier to applying the RF signal to the amplifier is less than 25 MHz.ns.

41. A circuit according to claim 23 wherein,
each input coupler comprises a delay circuit, the delay circuit for applying a predetermined time delay to the secondary input signal component, the predetermined time delay being approximately equal to the time delay from generating the primary input signal to generating the error feedback signal.

42. A circuit according to claim 23 wherein,
providing the circuit comprises providing at least a semiconductor integrated circuit.

43. A circuit according to claim 23 comprising;
providing a first predetermined portion of the circuit as a first semiconductor integrated circuit;
providing a second predetermined portion of the circuit as a second semiconductor integrated circuit; and,
assembling the first and second semiconductor integrated circuits to reduce the time delay from providing the output signal at the amplifier to providing the RF signal to the amplifier.

44. A circuit according to claim 23 comprising;
providing a first predetermined portion of the circuit as a first package, the first package comprising at least a first semiconductor circuit and first package pins;
providing a second predetermined portion of the circuit as a second package, the second package comprising at least a second semiconductor circuit and second package pins; and,
assembling at least one of the first semiconductor integrated circuit and first package, the second semiconductor integrated circuit and second package, and the first and second packages to reduce the time delay from providing the output signal at the amplifier to providing the RF signal to the amplifier.

45. A circuit according to claim 44 wherein, assembling the first and second packages comprises providing placement of at least one of first package pins within the first package and second package pins within the second package to reduce a measure of the length of the electrical connections between the first and second packages.

* * * * *